United States Patent
Han et al.

(10) Patent No.: US 11,980,082 B2
(45) Date of Patent: May 7, 2024

(54) MANUFACTURING METHOD OF DISPLAY DEVICE AND DISPLAY DEVICE USING THE SAME

(71) Applicant: SAMSUNG DISPLAY CO., LTD., Yongin-si (KR)

(72) Inventors: Seul Gi Han, Suwon-si (KR); Seok Soon Back, Suwon-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 304 days.

(21) Appl. No.: 17/468,669

(22) Filed: Sep. 8, 2021

(65) Prior Publication Data

US 2022/0208892 A1 Jun. 30, 2022

(30) Foreign Application Priority Data

Dec. 28, 2020 (KR) .......................... 10-2020-0184724

(51) Int. Cl.
*H01L 27/32* (2006.01)
*H01L 51/00* (2006.01)
*H01L 51/56* (2006.01)
*H10K 59/122* (2023.01)
*H10K 59/88* (2023.01)
*H10K 71/00* (2023.01)
*H10K 71/13* (2023.01)
(Continued)

(52) U.S. Cl.
CPC .......... *H10K 59/88* (2023.02); *H10K 59/122* (2023.02); *H10K 71/00* (2023.02); *H10K 71/135* (2023.02); *H10K 71/40* (2023.02); *H10K 59/1201* (2023.02)

(58) Field of Classification Search
CPC .............................. H10K 59/00; H10K 59/88
See application file for complete search history.

(56) References Cited

U.S. PATENT DOCUMENTS 9,761,801 B2 9/2017 Kang
9,818,941 B2 11/2017 Min
10,672,838 B2 * 6/2020 Nishikiori ............ H10K 59/122
(Continued)

FOREIGN PATENT DOCUMENTS

KR 10-2014-0074629 6/2014
KR 10-2015-0021169 3/2015
(Continued)

OTHER PUBLICATIONS

Machine translation, Choi, Korean Pat. Pub. No. KR102058706B1, translation date: Sep. 8, 2023, Espacenet, all pages. (Year: 2023).*
(Continued)

Primary Examiner — Victoria K. Hall
(74) Attorney, Agent, or Firm — KILE PARK REED & HOUTTEMAN PLLC

(57) ABSTRACT

An embodiment of the present invention provides a manufacturing method of a display device, including: forming a pixel circuit portion overlapping a display area on a substrate; forming a first electrode that is electrically connected to the pixel circuit portion; forming a partition wall overlapping a portion of the first electrode; forming a dummy line overlapping a peripheral area surrounding the display area by using a dispenser; and forming at least a portion of an intermediate layer in the partition wall by an inkjet process.

19 Claims, 22 Drawing Sheets

(51) Int. Cl.
*H10K 71/40* (2023.01)
*H10K 59/12* (2023.01)

(56) References Cited

U.S. PATENT DOCUMENTS

| | | | | |
|---|---|---|---|---|
| 2014/0161968 | A1* | 6/2014 | Kang | H05B 33/10 |
| | | | | 118/313 |
| 2015/0179099 | A1* | 6/2015 | Go | H10K 71/00 |
| | | | | 345/82 |
| 2015/0179720 | A1* | 6/2015 | Go | H10K 59/124 |
| | | | | 438/23 |
| 2016/0071726 | A1* | 3/2016 | Mizuno | H01L 22/20 |
| | | | | 438/16 |
| 2020/0052062 | A1* | 2/2020 | Liu | H10K 59/173 |
| 2022/0384761 | A1* | 12/2022 | Ni | H10K 59/122 |

FOREIGN PATENT DOCUMENTS

| | | | | |
|---|---|---|---|---|
| KR | 10-2015-0021169 A | * | 3/2015 | ............ H10K 50/86 |
| KR | 10-2016-0141127 | | 12/2016 | |
| KR | 10-2016-0141127 A | * | 12/2016 | ............ H01L 27/32 |
| KR | 10-2016-0148791 | | 12/2016 | |

OTHER PUBLICATIONS

Machine translation, Son, Korean Pat. Pub. No. KR2016-0141127A, translation date: Sep. 8, 2023, Espacenet, all pages. (Year: 2023).*

* cited by examiner

MANUFACTURING METHOD OF DISPLAY DEVICE AND DISPLAY DEVICE USING THE SAME

CROSS-REFERENCE TO RELATED APPLICATION

This application claims priority from and the benefit of Korean Patent Application No. 10-2020-0184724, filed on Dec. 28, 2020, which is hereby incorporated by reference for all purposes as if fully set forth herein.

BACKGROUND OF THE INVENTION

Field

Embodiments of the invention relate generally to a manufacturing method of a display device and a display device manufactured using the same.

Discussion of the Background

A display device serves to display a screen, and includes a liquid crystal display, an organic light emitting diode display, and the like. Such a display device is used in various electronic devices such as mobile phones, navigation units, digital cameras, electronic books, portable game machines, and various terminals.

Such a display device may be formed by stacking a plurality of layers, and various methods may be used to pattern these layers. For example, a photo and etching process, a chemical mechanical polishing process, an inkjet printing process, and the like may be used.

The above information disclosed in this Background section is only for understanding of the background of the inventive concepts, and therefore, it may contain information that does not constitute prior art.

SUMMARY OF THE INVENTION

Embodiments relate to a uniformly dried intermediate layer and a manufacturing method for a display device including the same.

Additional features of the inventive concepts will be set forth in the description which follows, and in part will be apparent from the description, or may be learned by practice of the inventive concepts.

An embodiment of the present invention provides a manufacturing method of a display device, including: forming a pixel circuit portion overlapping a display area on a substrate; forming a first electrode that is electrically connected to the pixel circuit portion; forming a partition wall overlapping a portion of the first electrode; forming a dummy line overlapping a peripheral area surrounding the display area by using a dispenser; and forming at least a portion of an intermediate layer in the partition wall by an inkjet process.

The dummy line may include a first solvent, and a viscosity of the first solvent may be about 15 cP or more, while a surface tension of the first solvent may be about 35 dyne/cm or more.

The forming of the intermediate layer may include: forming a first functional layer; forming a second functional layer; and forming an emission layer.

The forming of the first functional layer may include discharging and drying a first ink, the forming of the second functional layer may include discharging and drying a second ink, and the forming of the emission layer may include discharging and drying a third ink.

The first ink, the second ink, and the third ink may include a second solvent.

A vapor pressure of the second solvent may be lower than that of the first solvent.

The second solvent may have a range of 1 to $10^{-6}$ Torr at room temperature (25° C.) and atmospheric pressure.

The first solvent may include at least one of cyclopentane, thiophene, n-butylcyclopentane, n-butylbutyrate, hexylacetate, n-butylcyclohexane, trimethylbenzene, p-diethylbenzene, n-butylbenzene, 1,2-diethylbenzene, n-heptylacetate, propyl glycol, and propylene glycol, and the second solvent may include at least one of cyclohexyl benzene, 2-ethyl naphthalene, ethyl benzoate, triethylene glycol monomethyl ether, butyl benzoate, ethylhexyl benzoate, and benzyl benzoate.

The forming of the dummy line may include forming a first dummy line before the forming of the first functional layer.

The first dummy line may be removed in the drying of the first ink.

The forming of the dummy line may include forming a second dummy line before the forming of the second functional layer.

The second dummy line may be removed in the drying of the second ink.

The forming of the dummy line may include forming a third dummy line before the forming of the emission layer.

The third dummy line may be removed in the drying of the third ink.

A vapor pressure of the first solvent may be higher than that of the second solvent.

A volatilization rate of the first solvent may be greater than that of the second solvent.

The first functional layer may be a hole injection layer, and the second functional layer may be a hole transport layer.

The manufacturing method may further include forming a third functional layer and a second electrode disposed on the emission layer.

The dummy line may be formed in a lattice shape in a plan view.

A display device manufactured using the above-described manufacturing method of the display device may be included.

According to embodiments, because uniform drying of the intermediate layer is possible over the entire display area, it is possible to provide a display device in which spot generation is controlled.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

DETAILED DESCRIPTION OF THE EMBODIMENTS

Figure 1:
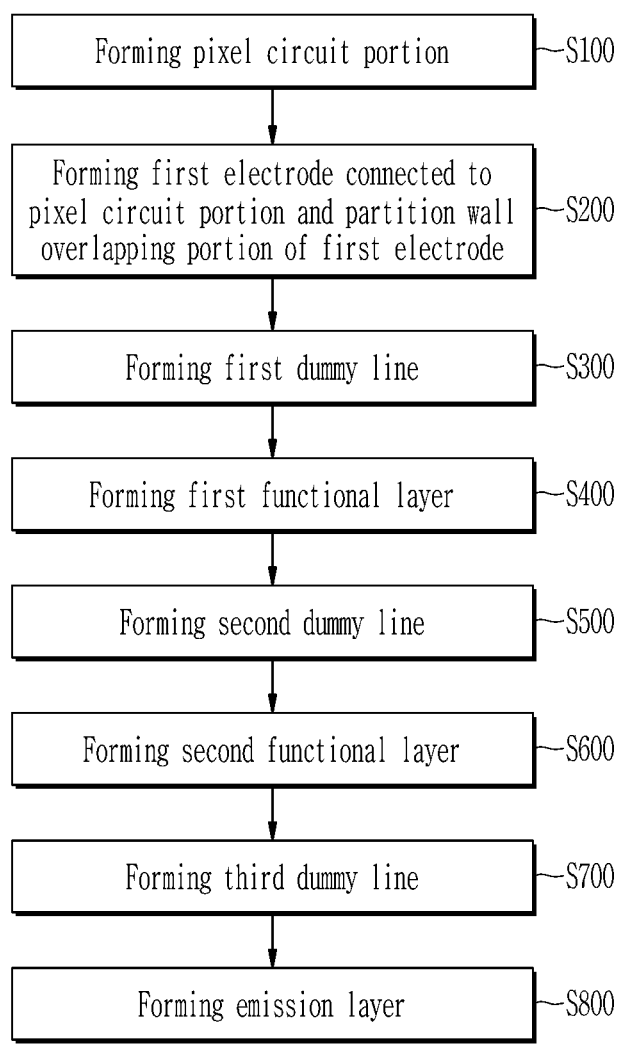
FIG. 1 is a flowchart illustrating a manufacturing method of a display device according to an embodiment.

In the following description, for the purposes of explanation, numerous specific details are set forth in order to provide a thorough understanding of various exemplary embodiments or implementations of the invention. As used herein "embodiments" and "implementations" are interchangeable words that are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are illustrated in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the DR1-axis, the DR2-axis, and the DR3-axis are not limited to three axes of a rectangular coordinate system, such as the x, y, and z-axes, and may be interpreted in a broader sense. For example, the DR1-axis, the DR2-axis, and the DR3-axis may be perpendicular to one another, or may represent different directions that are not perpendicular to one another.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

As customary in the field, some exemplary embodiments are described and illustrated in the accompanying drawings in terms of functional blocks, units, and/or modules. Those skilled in the art will appreciate that these blocks, units, and/or modules are physically implemented by electronic (or optical) circuits, such as logic circuits, discrete components, microprocessors, hard-wired circuits, memory elements, wiring connections, and the like, which may be formed using semiconductor-based fabrication techniques or other manufacturing technologies. In the case of the blocks, units, and/or modules being implemented by microprocessors or other similar hardware, they may be programmed and controlled using software (e.g., microcode) to perform various functions discussed herein and may optionally be driven by firmware and/or software. It is also contemplated that each block, unit, and/or module may be implemented by dedicated hardware, or as a combination of dedicated hardware to perform some functions and a processor (e.g., one or more programmed microprocessors and associated circuitry) to perform other functions. Also, each block, unit, and/or module of some exemplary embodiments may be physically separated into two or more interacting and discrete blocks, units, and/or modules without departing from the scope of the inventive concepts. Further, the blocks, units, and/or modules of some exemplary embodiments may be physically combined into more complex blocks, units, and/or modules without departing from the scope of the inventive concepts.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Hereinafter, a manufacturing method of a display device and a display device manufactured thereby according to an embodiment will be described with reference to a flowchart of a manufacturing method of FIG. 1 and drawings of FIG. 2 to FIG. 22. FIG. 1 is a flowchart illustrating a manufacturing method of a display device according to an embodiment, FIG. 2, FIG. 4, FIG. 6, FIG. 8, FIG. 10, FIG. 12, FIG. 14, FIG. 16, FIG. 18, and FIG. 20 illustrate top plan views of a display device during a manufacturing process according to an embodiment, FIG. 3, FIG. 5, FIG. 7, FIG. 9, FIG. 11, FIG. 13, FIG. 15, FIG. 17, FIG. 19, and FIG. 21 illustrate cross-sectional views of a display device during a manufacturing process according to an embodiment, and FIG. 22 illustrates a cross-sectional view of a display device according to an embodiment.

Figure 2:
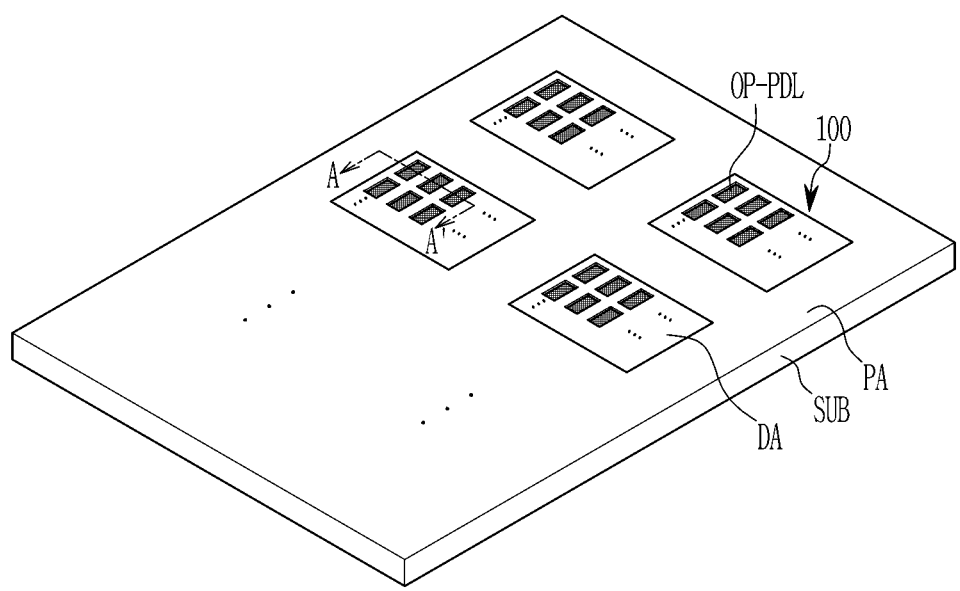
FIG. 2, FIG. 4, FIG. 6, FIG. 8, FIG. 10, FIG. 12, FIG. 14, FIG. 16, FIG. 18, and FIG. 20 illustrate top plan views of a display device during a manufacturing process according to an embodiment.
Figure 3:
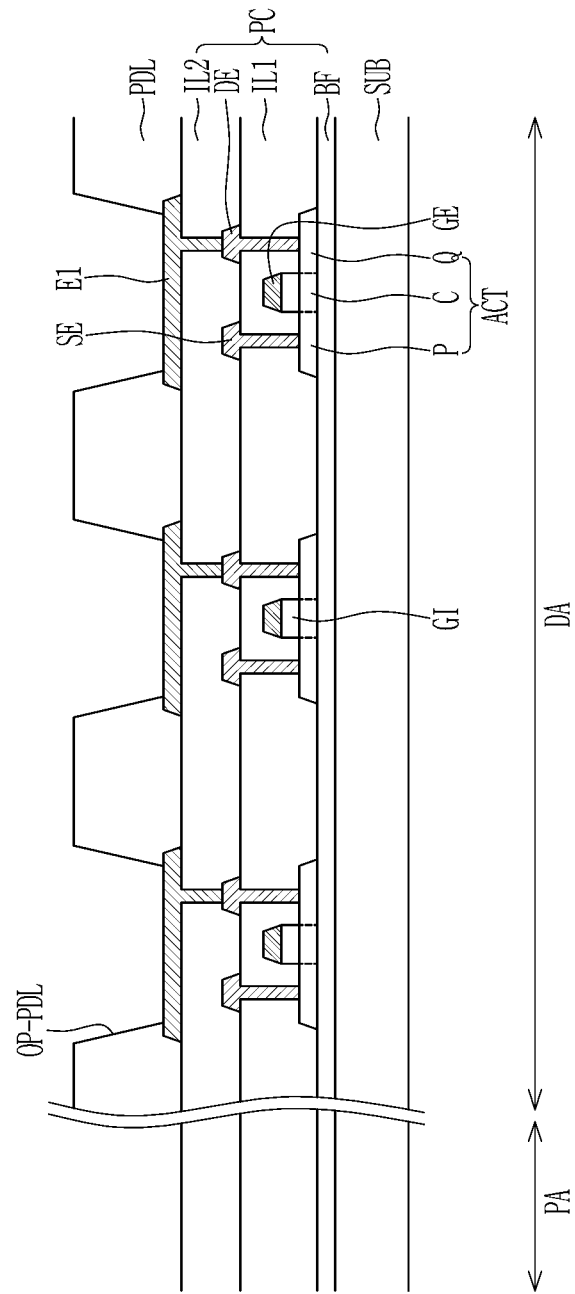
FIG. 3, FIG. 5, FIG. 7, FIG. 9, FIG. 11, FIG. 13, FIG. 15, FIG. 17, FIG. 19, and FIG. 21 illustrate cross-sectional views of a display device during a manufacturing process according to an embodiment.

Referring to FIG. 2 and FIG. 3 as well as FIG. 1, a pixel circuit portion PC disposed in a matrix form on a substrate SUB is formed (S100).

As illustrated in FIG. 2, a plurality of unit display panels 100 to be separated into a plurality of display panels using a cutting process may be disposed on the substrate SUB. The substrate SUB includes a display area DA configured to display an image on an entire surface thereof, and a peripheral area PA. The image is displayed in the display area DA. The periphery area PA may surround the display area DA. Although not illustrated in the present specification, the peripheral area PA may include a plurality of signal lines extending from the display area DA and a pad portion. Hereinafter, it will be described based on one unit display panel 100.

A stacked structure of the pixel circuit unit PC according to an embodiment will be first described with reference to FIG. 3.

The substrate SUB according to an embodiment may include an inorganic insulating material such as glass, or an organic insulating material such as plastic, e.g., polyimide (PI). The substrate SUB may be a single layer or a multi-layer. The substrate SUB may have a structure in which at least one base layer including a polymer resin sequentially stacked and at least one inorganic layer which are alternately stacked.

The substrate SUB may have various degrees of flexibility. The substrate SUB may be a rigid substrate, or a flexible substrate capable of bending, folding, rolling, or the like.

A buffer layer BF may be disposed on the substrate SUB. The buffer layer BF may be configured to prevent impurities from being transferred from the substrate SUB to an upper layer of the buffer layer BF, particularly a semiconductor active layer ACT, thereby preventing deterioration of a characteristic of the semiconductor active layer ACT and reducing stress in the device. The buffer layer BF may include an inorganic insulating material such as a silicon nitride or a silicon oxide, or may include an organic insulating material. A portion or an entire portion of the buffer layer BF may be omitted.

The semiconductor layer ACT is disposed on the buffer layer BF. The semiconductor active layer ACT may include at least one of polysilicon and an oxide semiconductor. The semiconductor active layer ACT includes a channel region C, a first region P, and a second region Q. The first region P and the second region Q are disposed at opposite sides of the channel region C, respectively. The channel region C includes a semiconductor doped with a small amount of impurities or a semiconductor that is not doped with impurities, and the first region P and the second region Q may include a semiconductor doped with a large amount of impurities compared to the channel region C. The first region P and the second region Q may represent a source and drain, respectively. The semiconductor active layer ACT may be formed by using an oxide semiconductor, and in this case, a separate protective layer (not illustrated) may be added to protect an oxide semiconductor material that is vulnerable to external environments such as a high temperature.

A first gate insulating layer GI may be disposed on the semiconductor active layer ACT. The first gate insulating layer GI may be a single layer or multiple layers including at least one of a silicon oxide ($SiO_x$), a silicon nitride ($SiN_x$), and a silicon oxynitride ($SiO_xN_y$).

A gate electrode GE is disposed on the first gate insulating layer GI. The gate electrode GE may be a single layer or a multilayer in which a metal film including any one of copper (Cu), a copper alloy, aluminum (Al), an aluminum alloy, molybdenum (Mo), and a molybdenum alloy is stacked. The gate electrode GE may overlap the gate insulating layer GI, and the channel region C of the semiconductor active layer ACT.

A first insulating layer IL1 is disposed on the gate electrode GE. The first insulating layer IL1 may be a single layer or multiple layers including at least one of a silicon oxide ($SiO_x$), a silicon nitride ($SiN_x$) and a silicon oxynitride ($SiO_xN_y$).

A source electrode SE and a drain electrode DE are positioned on the first insulating layer IL1. The source electrode SE and the drain electrode DE are respectively connected to the first region P and the second region Q of the semiconductor layer ACT through contact holes.

The source electrode SE and the drain electrode DE may include aluminum (Al), platinum (Pt), palladium (Pd), silver (Ag), magnesium (Mg), gold (Au), nickel (Ni), neodymium (Nd), iridium (Ir), chromium (Cr), nickel (Ni), calcium (Ca), molybdenum (Mo), tantalum (Ta), titanium (Ti), tungsten (W), copper (Cu), and/or the like, and may have a single layer structure or a multilayer structure including the material.

A second insulating layer IL2 is positioned on the source electrode SE and the drain electrode DE. The second insulating layer IL2 may include a general purpose polymer such as poly(methyl methacrylate) (PMMA) or polystyrene (PS), a polymer derivative having a phenolic group, an organic insulating material such as an acrylic polymer, an imide polymer, a polyimide, an acrylic polymer, a siloxane polymer, etc.

A first electrode E1 may be disposed on the second insulating layer IL2. The first electrode E1 is connected to the drain electrode DE through a contact hole of the second insulating layer IL2. The first electrode E1 may include a metal such as silver (Ag), lithium (Li), calcium (Ca), aluminum (Al), magnesium (Mg), and gold (Au), and may also include a transparent conductive oxide (TCO) such as indium zinc oxide (IZO) and indium tin oxide (ITO). The first electrode E1 may be formed as a single layer including a metal material or a transparent conductive oxide, or a multiple layer including the same. For example, the first electrode E1 may have a triple layer structure of indium tin oxide (ITO)/silver (Ag)/indium tin oxide (ITO).

A transistor including the gate electrode GE, the semiconductor layer ACT, the source electrode SE, and the drain electrode DE may be electrically connected to the first electrode E1 to supply a current to a light emitting element.

According to an embodiment, a constituent element positioned between the substrate SUB and the first electrode E1 may be defined as the pixel circuit portion PC. This may be changed according to an embodiment, and in the present specification, a configuration in which the buffer layer BF to the second insulating layer IL2 are stacked is referred to as the pixel circuit portion PC.

According to an embodiment, the first electrode E1 is formed to be electrically connected to the pixel circuit portion PC (S200). In addition, as illustrated in FIG. 3, a partition wall PDL overlapping at least outer edge portions of the first electrode E1 is formed (S200). The partition wall PDL may be formed to have a pixel opening OP-PDL defining an emission area.

The pixel opening OP-PDL may have a planar shape that is substantially similar to that of the first electrode E1. Although the present specification illustrates an embodiment in which the pixel opening OP-PDL has a rectangular shape in a plan view, this is only an example, and may have any shape such as a rhombus shape or an octagonal shape similar to the rhombus, or a rectangle, polygon, or circle, in a plan view.

The partition wall PDL may include a general purpose polymer such as poly(methyl methacrylate) (PMMA) or polystyrene (PS), a polymer derivative having a phenolic group, an organic insulating material such as an acrylic polymer, an imide polymer, a polyimide, an acrylic polymer, a siloxane polymer, etc.

Although the present specification illustrates the first insulating layer ILL the second insulating layer IL2, and the buffer layer BF extending to the peripheral area PA, the present invention is not limited to this structure, and at least one of the buffer layer BF, the first insulating layer IL1, and the second insulating layer IL2 may be omitted. The stacked structure of the peripheral area PA may be variously changed.

Figure 4:
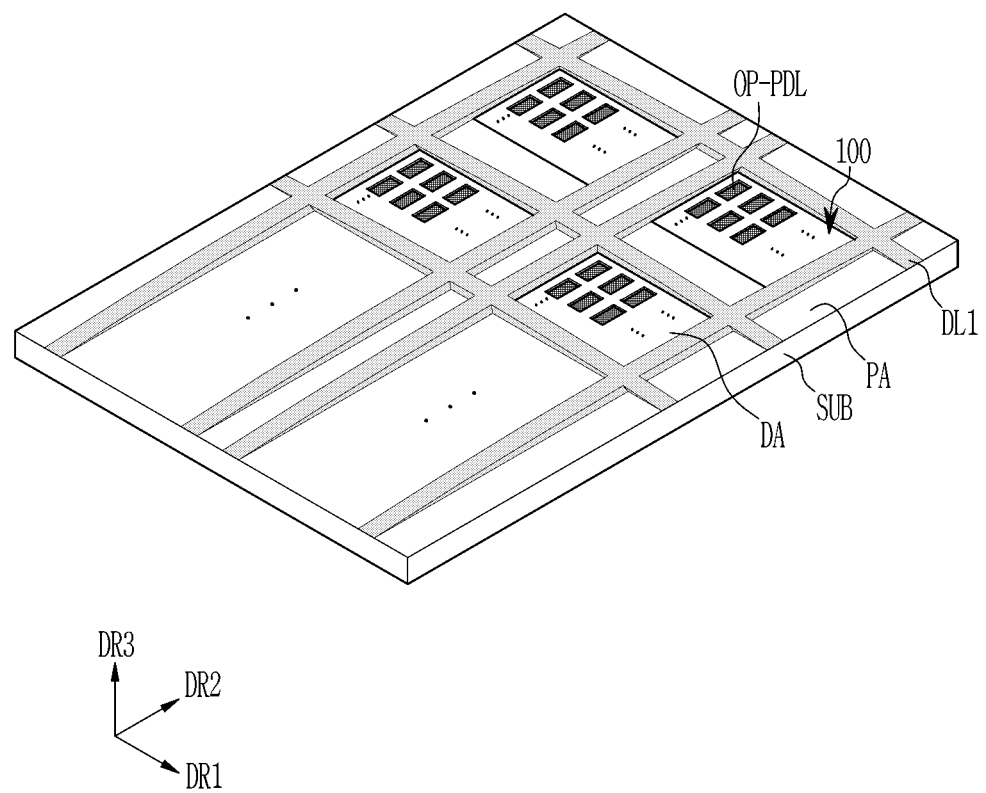
Figure 5:
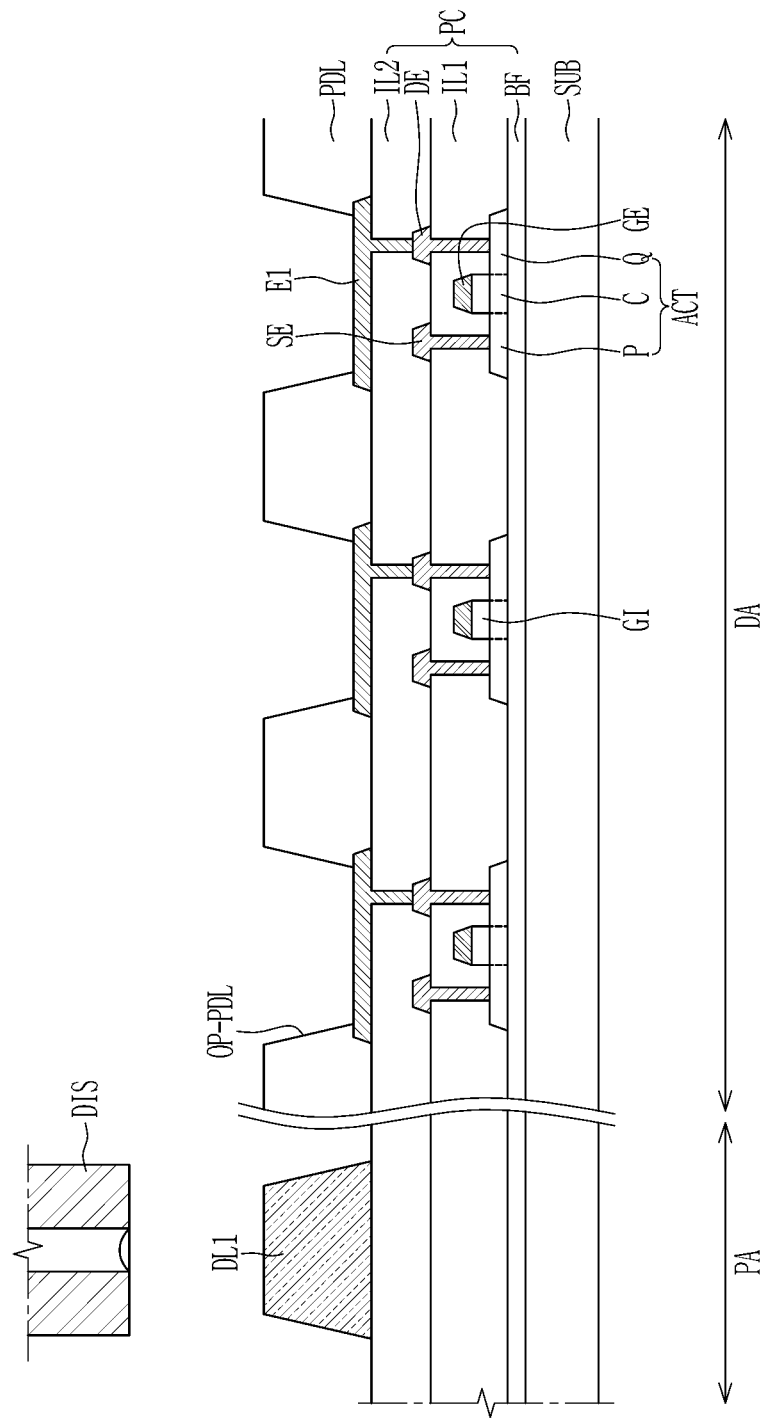

Next, referring to FIG. 4 and FIG. 5 as well as FIG. 1, a first dummy line DL1 is formed in the peripheral area PA surrounding the display area DA (S300). The first dummy line DL1 may have a shape surrounding the display area DA, and may have a lattice shape in a plan view.

As illustrated in FIG. 5, the first dummy line DL1 may be formed through a process of using a dispenser DIS. The process of using the dispenser DIS may be a line printing process, and an amount of discharge may be determined by setting a starting point and an ending point during one discharge. The dispenser DIS may discharge a first solvent using atmospheric pressure. The dispenser DIS may have almost no restriction on the solvent to be discharged.

The first dummy line DL1 may include the first solvent discharged from the dispenser DIS. The first solvent may include a solvent having a relatively higher vapor pressure than a second solvent to be described later.

The first solvent may include at least one of cyclopentane with a vapor pressure of 314 Torr, thiophene with a vapor pressure of 73.8 Torr, n-butylcyclopentane with a vapor pressure of 3.83 Torr, n-butylbutyrate with a vapor pressure of 1.76 Torr, hexylacetate with a vapor pressure of 1.45 Torr, n-butylcyclohexane with a vapor pressure of 1.27 Torr, trimethylbenzene with a vapor pressure of 1.17 Torr, p-diethylbenzene with a vapor pressure of 0.92 Torr, n-butylbenzene with a vapor pressure of 0.822 Torr, 1,2-diethylbenzene with a vapor pressure of 0.795 Torr, n-heptylacetate with a vapor pressure of 0.511 Torr, propyl glycol with a vapor pressure of 1.6 Torr, and propylene glycol with a vapor pressure of 0.08 Torr, under conditions of room temperature (25° C.) and atmospheric pressure, for example. The first solvent may include one or more solvents depending on a function and purpose of the dummy line.

The first solvent has a relatively high surface tension and may have a high viscosity. For example, the first solvent may have a viscosity of about 15 cP or more and a surface tension of about 35 dyne/cm or more. When the first solvent is discharged through the dispenser process, the first solvent having a high surface tension and a high viscosity may form the first dummy line DL1 and be deposited without spreading on the substrate SUB to undesired areas. A separate drying process may not be used.

Figure 6:
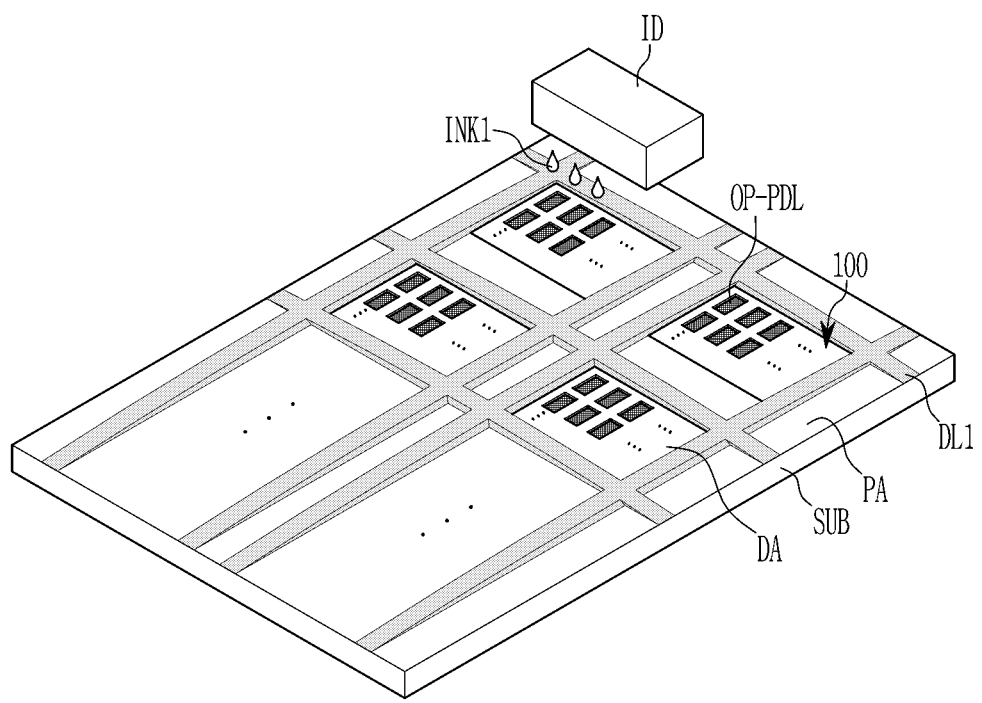
Figure 6:
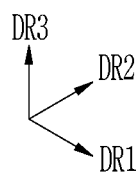
Figure 7:
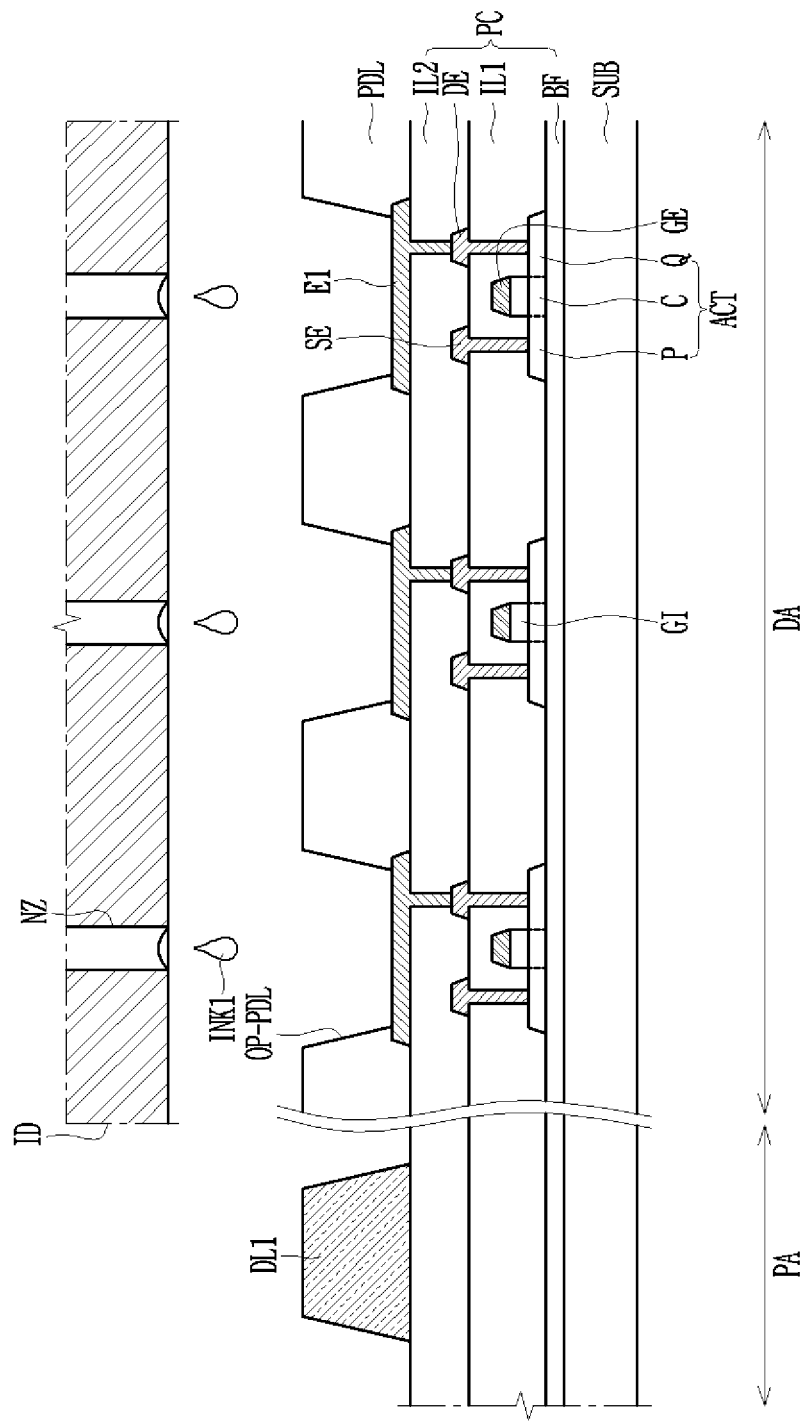

Next, referring to FIG. 6 and FIG. 7, a first ink INK1 is discharged into the pixel opening OP-PDL by using an inkjet printing apparatus ID. The first ink INK1 is a solution configured to form a first functional layer M1 (illustrated in subsequent figures), and the first functional layer M1 may be formed when the solvent included in the first ink INK1 is substantially completely evaporated on the substrate SUB. Substantially completely evaporated may refer to 99% or more of the solvent being evaporated from the deposited first ink INK1.

As illustrated in FIG. 7, the inkjet printing apparatus ID may include an inkjet head and a plurality of nozzles NZ disposed in the inkjet head. The inkjet printing apparatus ID discharges a small amount of a solution by applying a voltage or waveform to a piezo element. The plurality of nozzles NZ may be spaced apart at a predetermined interval. The plurality of nozzles NZ may be arranged in a line, in a matrix form, or in various forms. An amount of ink discharged once from each of the nozzles NZ may be a trace amount in a picoliter (pL) level. According to an embodiment, each of the nozzles NZ may be capable of discharging different amounts. Although not illustrated in the present specification, the inkjet printing apparatus may further include a moving unit configured to move the inkjet head and a controller configured to control a moving speed and a direction of the inkjet head.

The first ink INK1 may include a second solvent. The second solvent may be a solvent having a relatively lower vapor pressure than that of the first solvent. For example, the second solvent has a range of 1 to $10^{-6}$ Torr at room temperature (25° C.) and atmospheric pressure. For example, the second solvent may include at least one of cyclohexyl benzene with a vapor pressure of 0.04 Torr, 2-ethyl naphthalene with a vapor pressure of 0.03 Torr, ethyl benzoate with a vapor pressure of 0.27 Torr, triethylene glycol monomethyl ether with a vapor pressure of 3.5×10–3 Torr, butyl benzoate with a vapor pressure of 0.05 Torr, ethylhexyl benzoate with a vapor pressure of 5×10–4 Torr, and benzylbenzoate with a vapor pressure of 2×10–4 Torr. One or more solvents making up the second solvent may be included depending on a function and purpose of a layer formed through the first ink INK1. A volatilization rate of the second solvent may be smaller than that of the first solvent.

Figure 8:
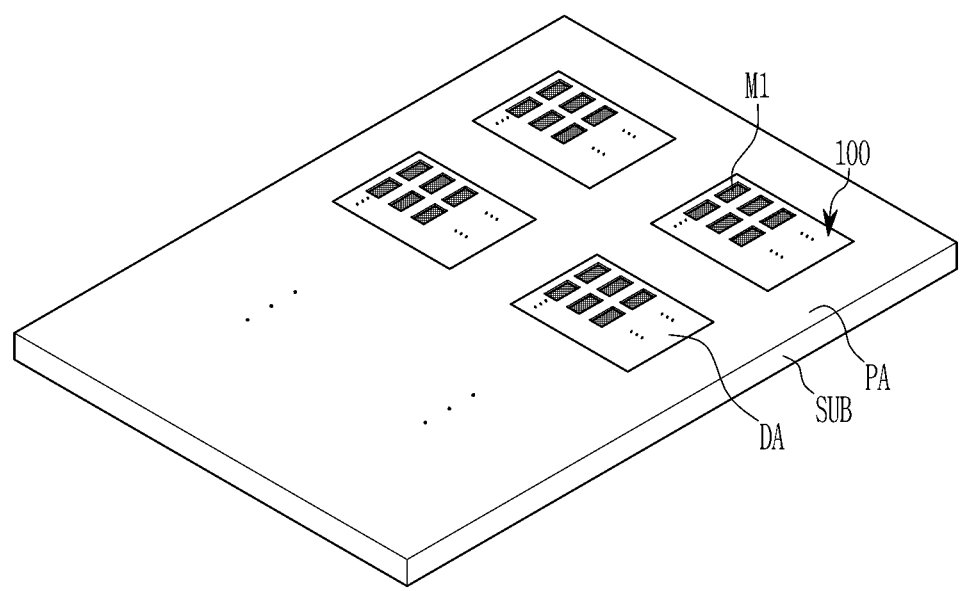
Figure 8:
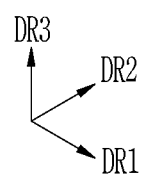
Figure 9:
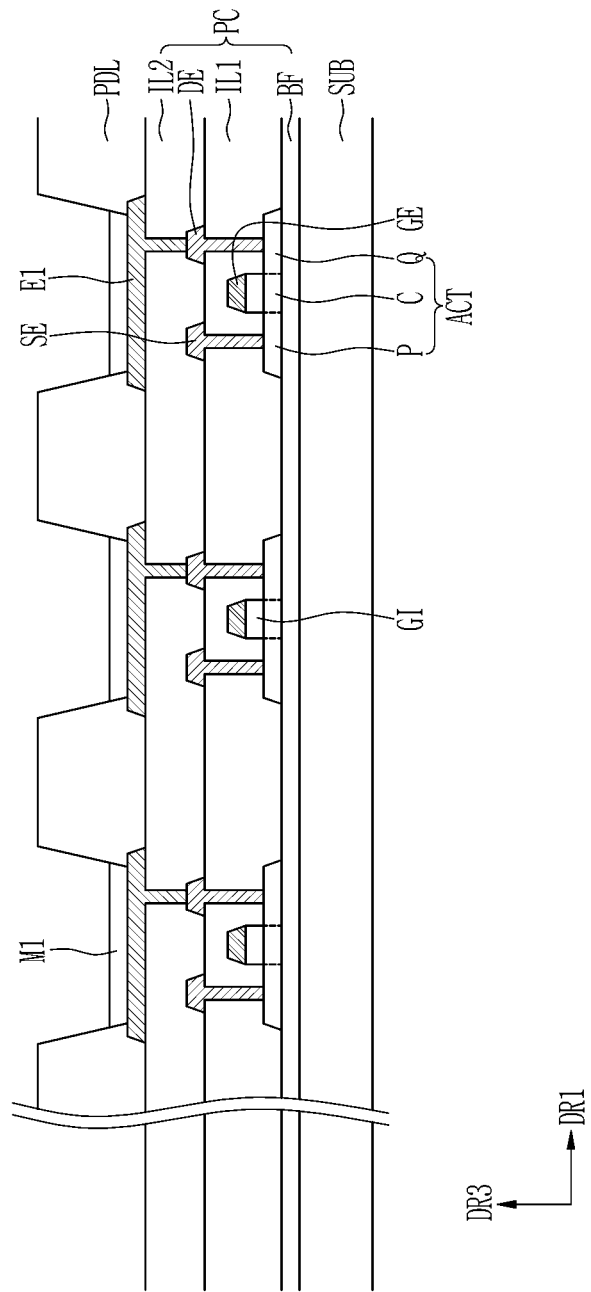

The first ink INK1 discharged into the pixel opening OP-PDL may form the first functional layer M1 as illustrated in FIG. 8 and FIG. 9 through a drying process (S400). The first functional layer M1 may be a hole injection layer.

The first dummy line DL1 positioned in the peripheral area PA may be removed through the drying process. The first solvent forming the first dummy line DL1 may be substantially completely volatilized through the drying process. That is, at least 99% of the first dummy line DL1 may be removed.

During the drying process, the first solvent having the relatively high vapor pressure may be evaporated at a faster rate compared to the second solvent. That is, the volatilization speed of the first solvent of the first dummy line DL1 may be faster than that of the second solvent in the first functional layer M1. The peripheral area PA in which the first dummy line DL1 including the first solvent is positioned may be saturated with the first solvent at a high speed. Thereafter, the second solvent having the relatively low vapor pressure may be evaporated. When the second solvent is evaporated, the volatilization rate of the first solvent in the peripheral area PA having relatively high atmospheric saturation may be lowered. The volatilization rates of the first solvent and the second solvent may be substantially the same in a state after a predetermined time has elapsed. In combination with the drying and evaporation of the first dummy line DL1, the first functional layer M1 formed by volatilization of the second solvent may be dried at a same volatilization rate over the display area DA, and therefore may have a uniform shape and thickness over the display area DA.

Figure 10:
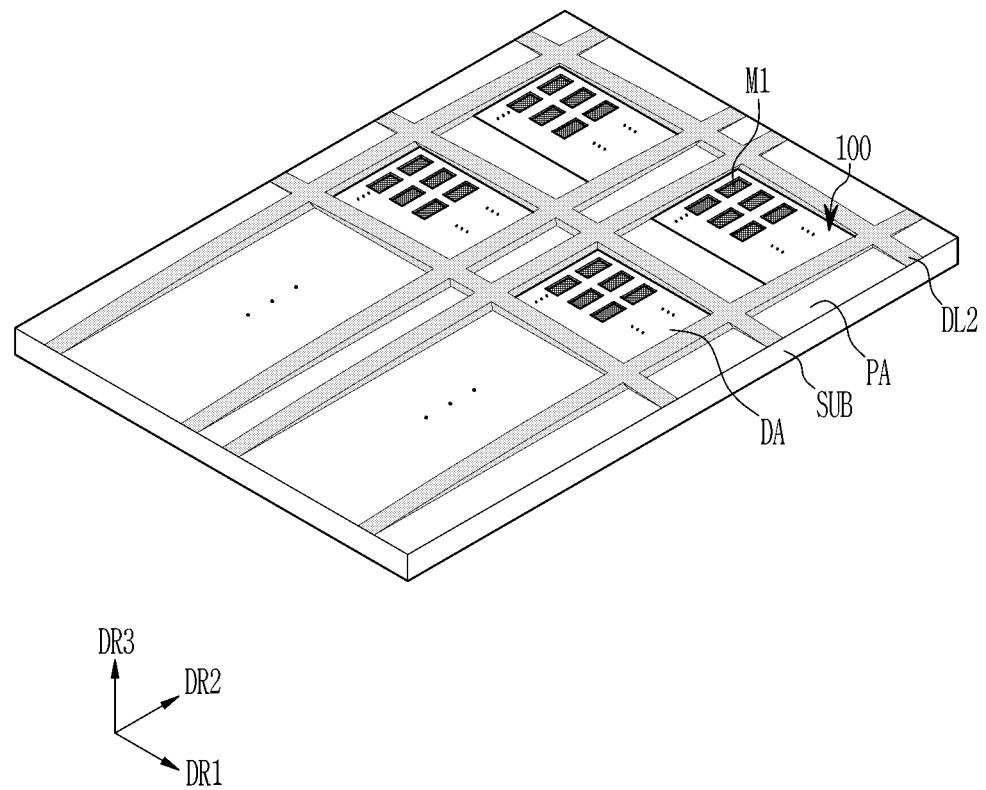
Figure 11:
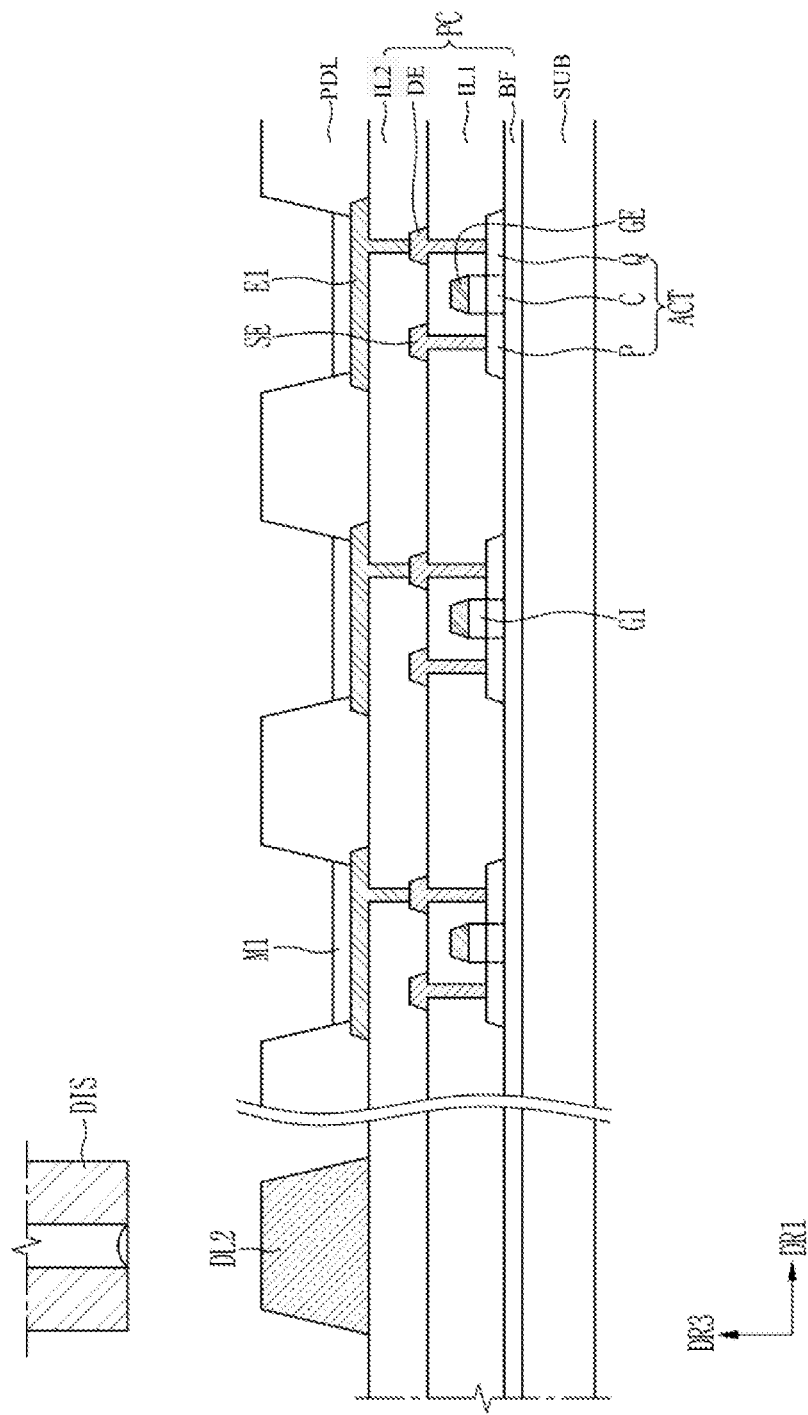

Next, referring to FIG. 10 and FIG. 11 as well as FIG. 1, a second dummy line DL2 may be formed in the peripheral area PA surrounding the display area DA (S500) in positions where the first dummy line DL1 has been removed. The second dummy line DL2 may have a shape surrounding the display area DA, and may have a lattice shape in a plan view. The second dummy line DL2 may be formed by using the process using the dispenser DIS.

The second dummy line DL2 may include the first solvent. The first solvent may include a solvent having a relatively higher vapor pressure than a second solvent. The first solvent may include at least one of cyclopentane with a vapor pressure of 314 Torr, thiophene with a vapor pressure of 73.8 Torr, n-butylcyclopentane with a vapor pressure of 3.83 Torr, n-butylbutyrate with a vapor pressure of 1.76 Torr, hexylacetate with a vapor pressure of 1.45 Torr, n-butylcyclohexane with a vapor pressure of 1.27 Torr, trimethylbenzene with a vapor pressure of 1.17 Torr, p-diethylbenzene with a vapor pressure of 0.92 Torr, n-butylbenzene with a vapor pressure of 0.822 Torr, 1,2-diethylbenzene with a vapor pressure of 0.795 Torr, n-heptylacetate with a vapor pressure of 0.511 Torr, propyl glycol with a vapor pressure of 1.6 Torr, and propylene glycol with a vapor pressure of 0.08 Torr, under conditions of room temperature (25° C.) and atmospheric pressure, for example. The first solvent forming the second dummy line DL2 and the first solvent forming the first dummy line DL1 may be the same or different. The second solvent may include one or more solvents depending on a function and purpose of the second dummy line DL2.

Figure 12:
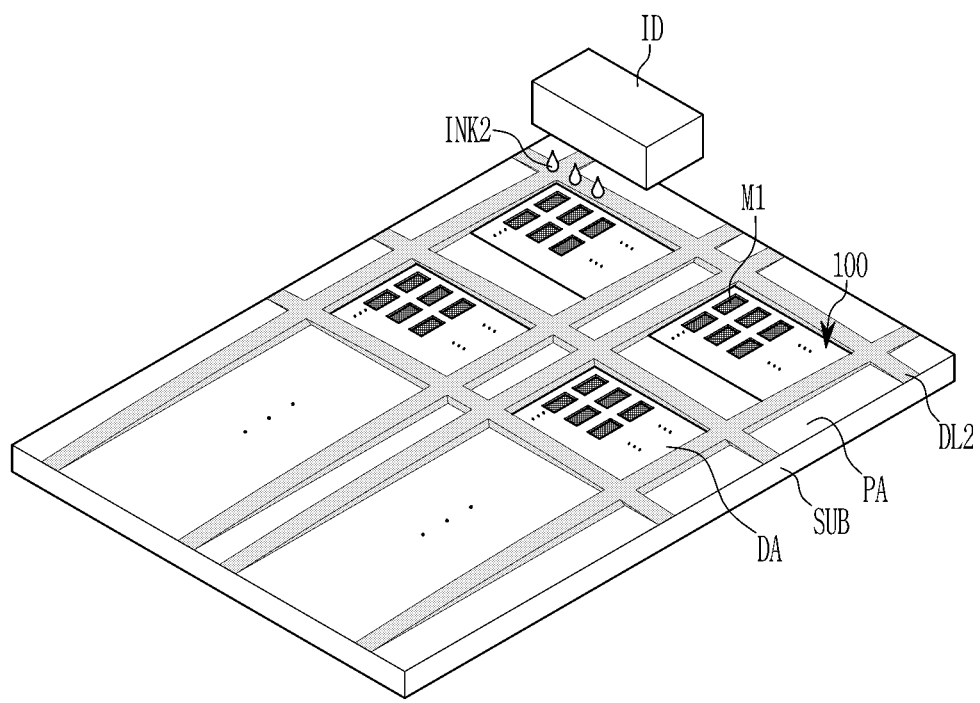
Figure 13:
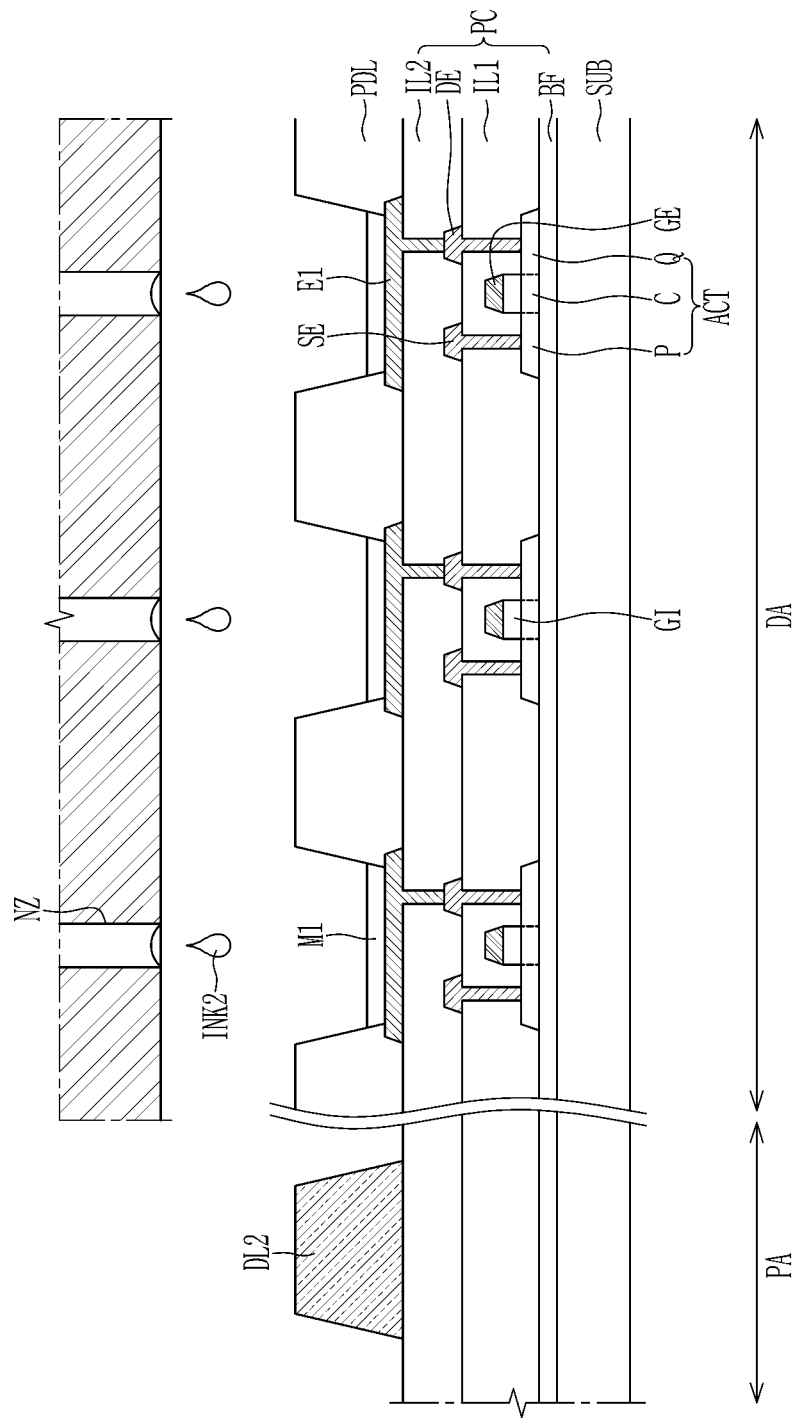

Next, referring to FIG. 12 and FIG. 13 as well as FIG. 1, a second ink INK2 is discharged into the pixel opening OP-PDL by using the inkjet printing apparatus ID.

The second ink INK2 may include a second solvent. The second solvent may be a solvent having a relatively lower vapor pressure than that of the first solvent. For example, it is has a range of 1 to $10^{-6}$ Torr at room temperature (25° C.) and atmospheric pressure. For example, the second solvent may include at least one of cyclohexyl benzene with a vapor pressure of 0.04 Torr, 2-ethyl naphthalene with a vapor pressure of 0.03 Torr, ethyl benzoate with a vapor pressure of 0.27 Torr, triethylene glycol monomethyl ether with a vapor pressure of 3.5×10–3 Torr, butyl benzoate with a vapor pressure of 0.05 Torr, ethylhexyl benzoate with a vapor pressure of 5×10–4 Torr, and benzylbenzoate with a vapor pressure of 2×10–4 Torr. One or more solvents may be included depending on a function and purpose of a layer formed through the second ink INK2.

The second solvent may have a relatively lower vapor pressure than that of the first solvent. A volatilization rate of the second solvent may be smaller than that of the first solvent.

The second ink INK2 is a solution configured to form a second functional layer M2, and the second functional layer M2 may be formed when the second solvent is substantially completely evaporated on the substrate SUB. Substantially completely evaporated may refer to 99% or more of the second solvent being evaporated from the deposited second ink INK2.

Figure 14:
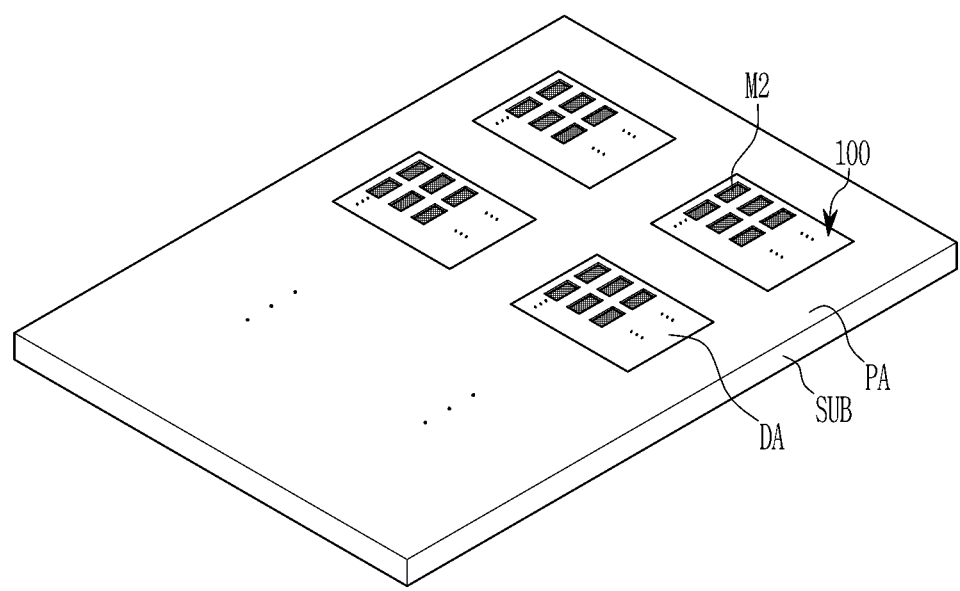
Figure 15:
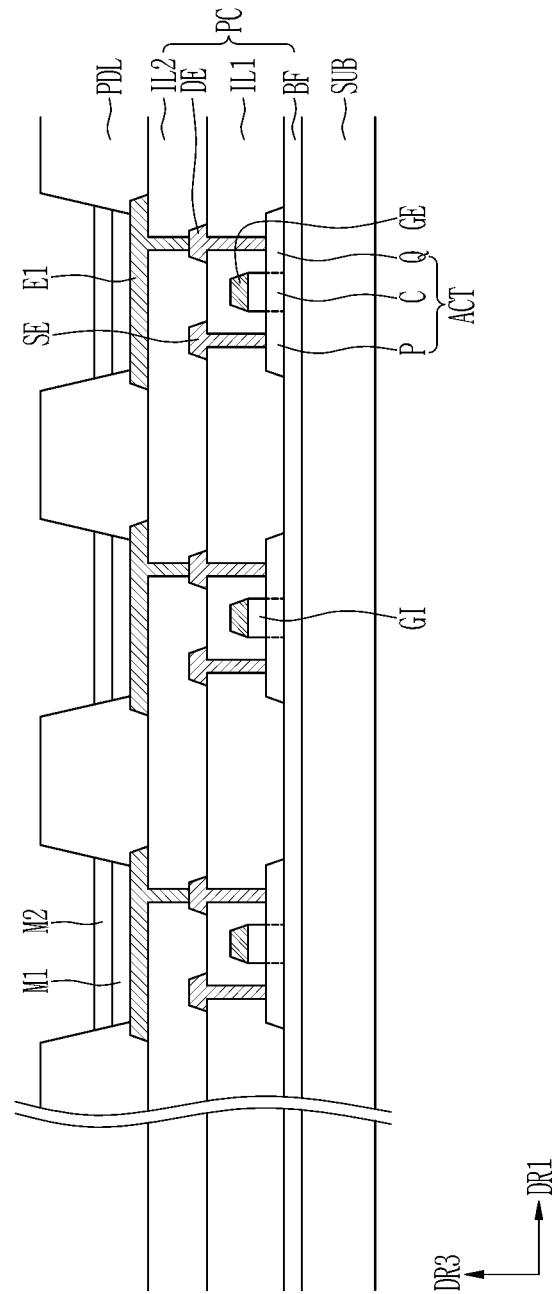

The second ink INK2 discharged into the pixel opening OP-PDL may form the second functional layer M2 atop the first functional layer M1 as illustrated in FIG. 14 and FIG. 15 through a drying process (S600). The second functional layer M2 may be a hole transport layer.

The second dummy line DL2 positioned in the peripheral area PA may be removed through the drying process. The second solvent forming the second dummy line DL2 may be substantially completely volatilized and removed through the drying process.

During the drying process, the first solvent having the relatively high vapor pressure may be evaporated at a faster rate compared to the second solvent. The peripheral area PA in which the second dummy line DL2 including the first solvent is positioned may be saturated with the first solvent at a high speed. Thereafter, the second solvent having the relatively low vapor pressure may be evaporated. When the second solvent is evaporated, the volatilization rate of the first solvent in the peripheral area PA having relatively high atmospheric saturation may be lowered. The volatilization rates of the first solvent and the second solvent may be substantially the same in a state where a predetermined time has elapsed. The second functional layer M2 formed by volatilization of the second solvent may be dried at a same volatilization rate over the display area DA, to thereby have a uniform shape and thickness.

Figure 16:
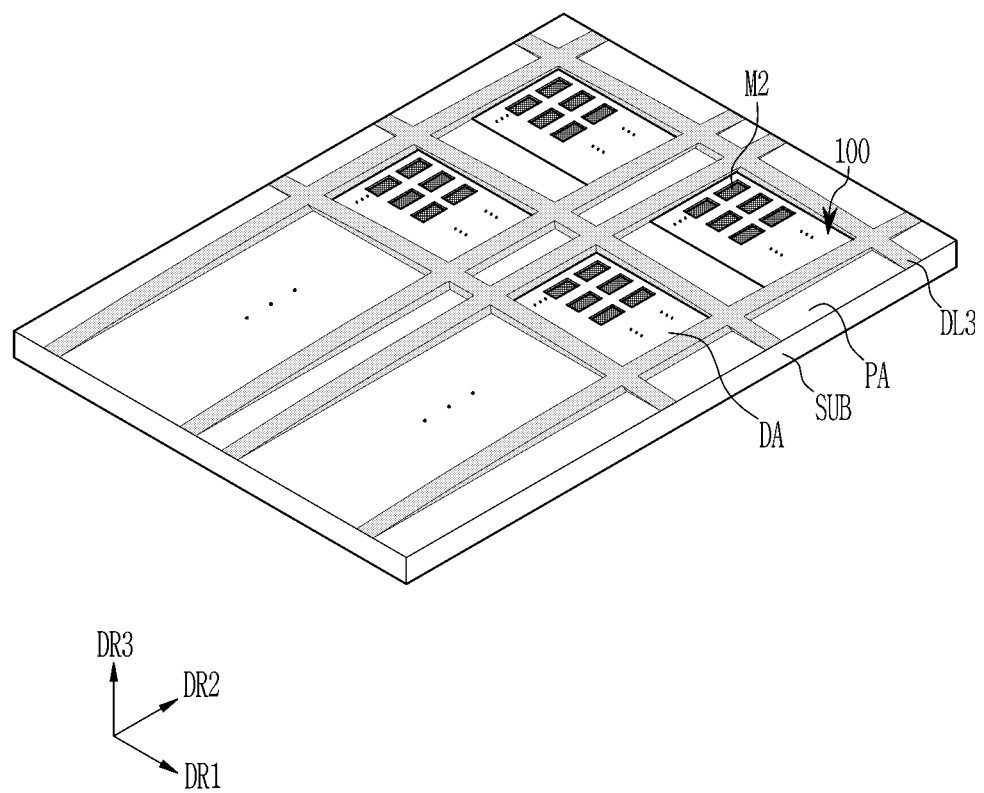
Figure 17:
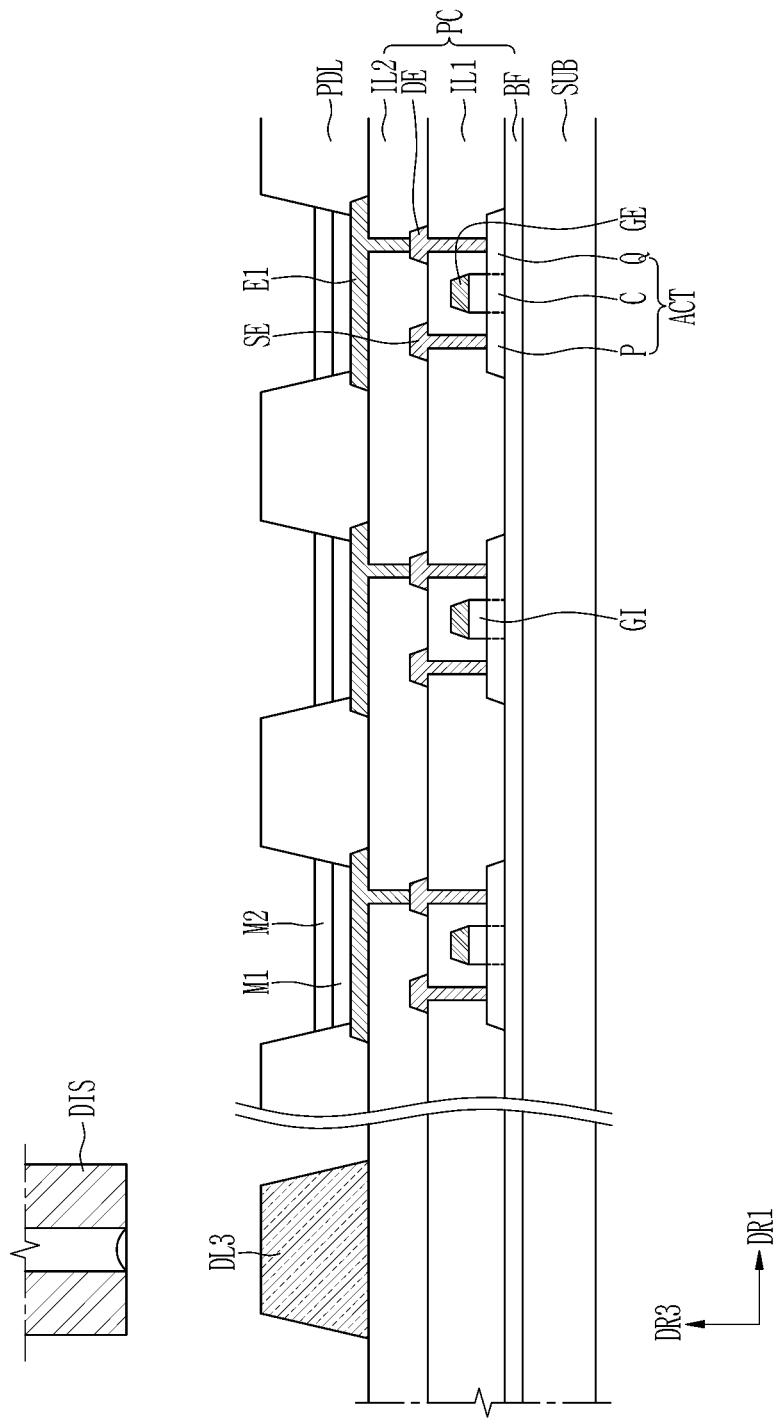

Next, referring to FIG. 16 and FIG. 17 as well as FIG. 1, a third dummy line DL3 is formed in the peripheral area PA surrounding the display area DA (S700). The third dummy line DL3 may have a shape surrounding the display area DA, and may have a lattice shape in a plan view. The third dummy line DL3 may be formed by using the process using the dispenser DIS.

The third dummy line DL3 may include the first solvent. The first solvent may include a solvent having a relatively higher vapor pressure than a second solvent. The first solvent may include at least one of cyclopentane with a vapor pressure of 314 Torr, thiophene with a vapor pressure of 73.8 Torr, n-butylcyclopentane with a vapor pressure of 3.83 Torr, n-butyl butyrate with a vapor pressure of 1.76 Torr, hexyl acetate with a vapor pressure of 1.45 Torr, n-butylcyclohexane with a vapor pressure of 1.27 Torr, trimethylbenzene with a vapor pressure of 1.17 Torr, p-diethylbenzene with a vapor pressure of 0.92 Torr, n-butylbenzene with a vapor pressure of 0.822 Torr, 1,2-diethylbenzene with a vapor pressure of 0.795 Torr, n-heptylacetate with a vapor pressure of 0.511 Torr, propyl glycol with a vapor pressure of 1.6 Torr, and propylene glycol with a vapor pressure of 0.08 Torr, under conditions of room temperature (25° C.) and atmospheric pressure, for example. The first solvent may include one or more solvents depending on a function and purpose of the third dummy line.

The first solvent having high surface tension and a high viscosity may form the third dummy line DL3 without spreading on the substrate SUB to undesired areas. A separate drying process in addition to drying the ink layer may not be used. Drying of the first solvent of the dummy lines may be used in conjunction with drying the second solvent of the ink layers to normalize drying of both lines at a same rate, thus forming the dried ink layers having a uniform thickness.

Figure 18:
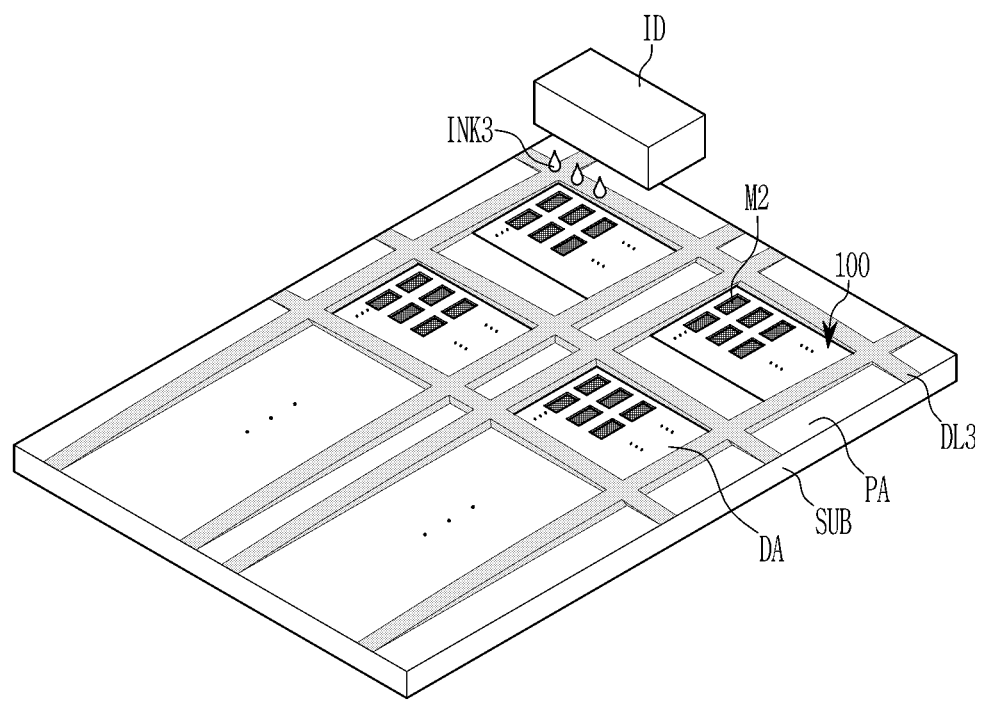
Figure 19:
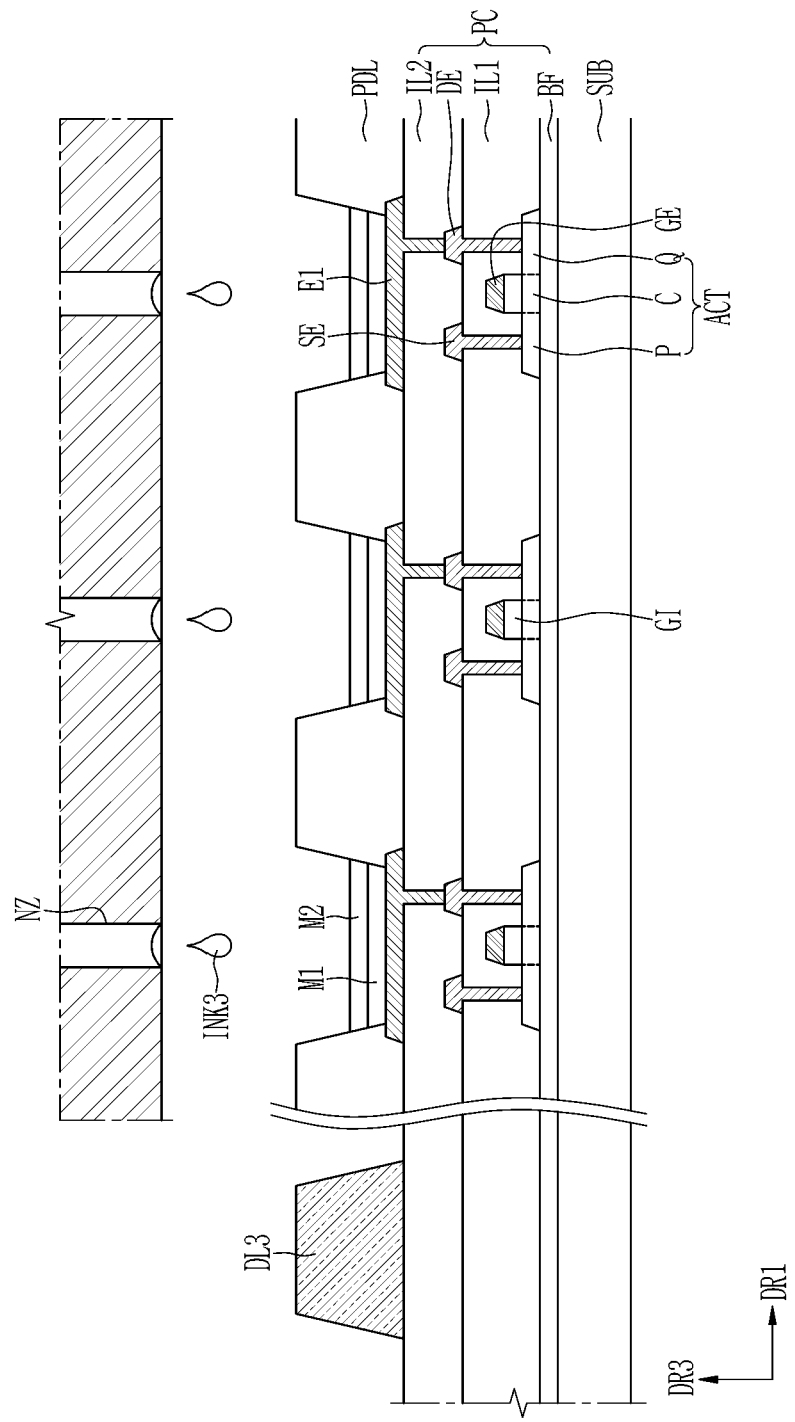

Next, referring to FIG. 18 and FIG. 19 as well as FIG. 1, a third ink INK3 is discharged into the pixel opening OP-PDL by using an inkjet process.

The third ink INK3 may include a second solvent. The second solvent may be a solvent having a relatively lower vapor pressure than that of the first solvent. For example, it has a range of 1 to $10^{-6}$ Torr at room temperature (25° C.) and atmospheric pressure. For example, the second solvent may include at least one of cyclohexyl benzene with a vapor pressure of 0.04 Torr, 2-ethyl naphthalene with a vapor pressure of 0.03 Torr, ethyl benzoate with a vapor pressure of 0.27 Torr, triethylene glycol monomethyl ether with a vapor pressure of 3.5×10-3 Torr, butyl benzoate with a vapor pressure of 0.05 Torr, ethylhexyl benzoate with a vapor pressure of 5×10-4 Torr, and benzylbenzoate with a vapor pressure of 2×10-4 Torr. One or more solvents may be included depending on a function and purpose of a layer formed through the third ink INK3.

The second solvent may have a relatively lower vapor pressure than that of the first solvent. A volatilization rate of the second solvent may be smaller than that of the first solvent.

The third ink INK3 may be a solution to form the light emitting layer M3, and may include at least one of a red emission material, a green emission material, and a blue emission material.

Figure 20:
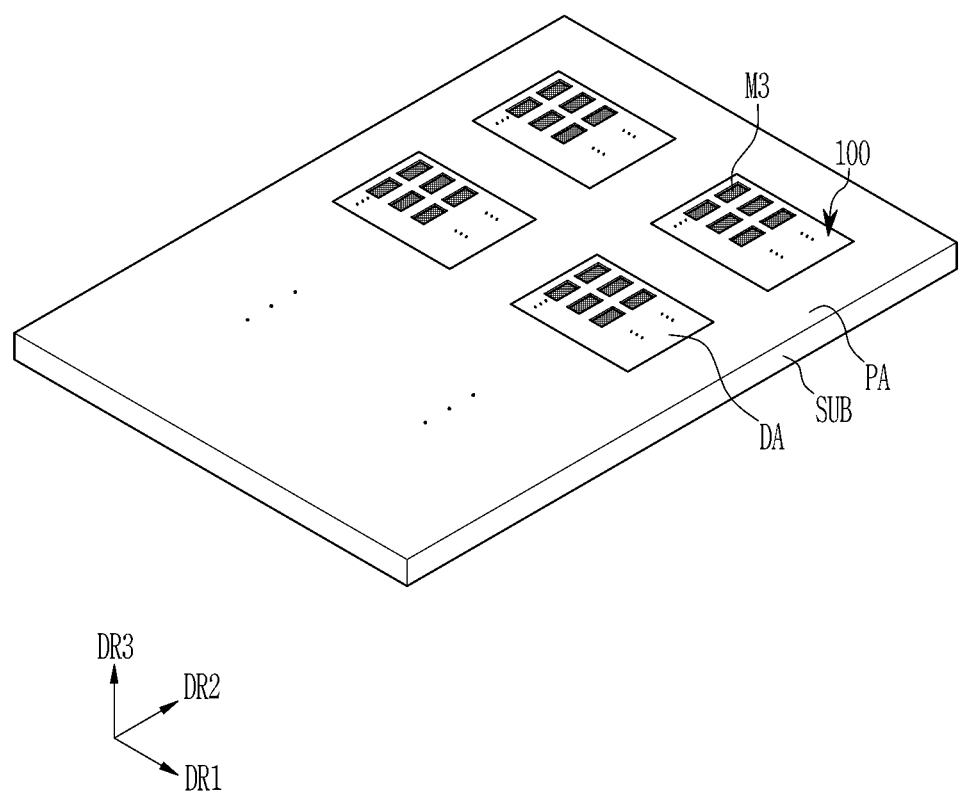
Figure 21:
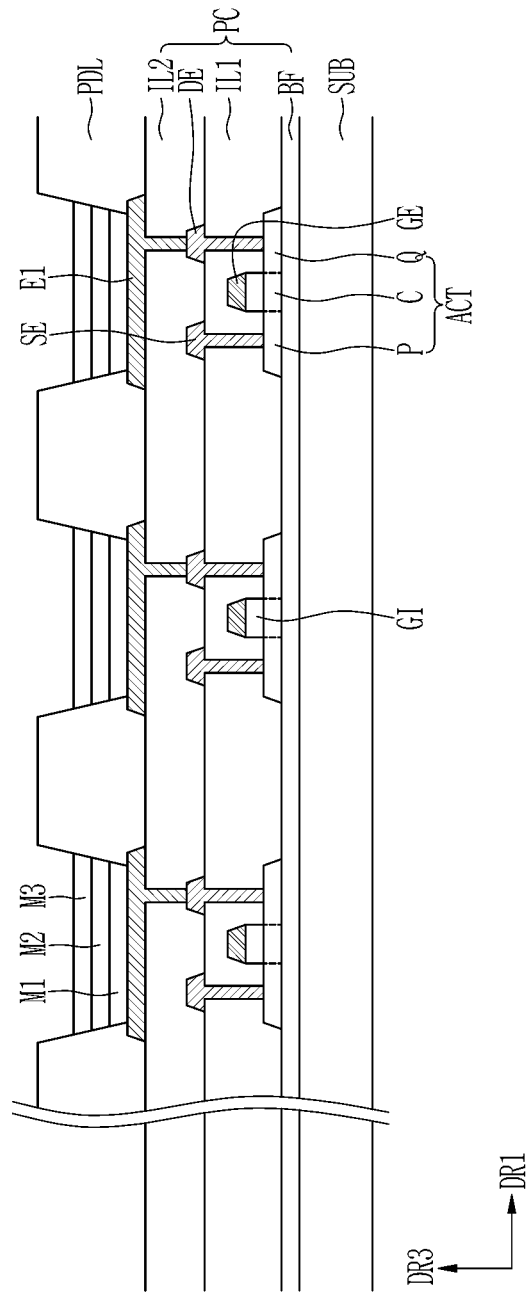
Figure 22:
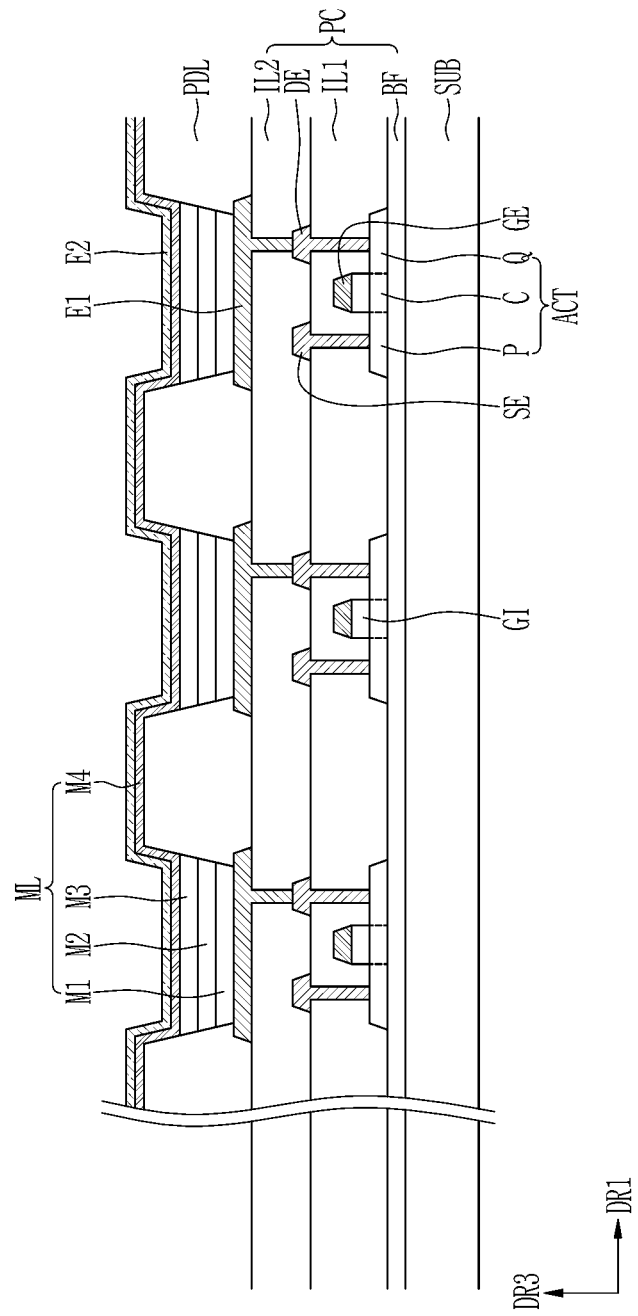
FIG. 22 illustrates a cross-sectional view of a display device according to an embodiment.

The third ink INK3 discharged into the pixel opening OP-PDL may form the emission layer M3 as illustrated in FIG. 20 and FIG. 21 through a drying process (S800). The emission layer M3 may include an organic material and/or an inorganic material.

The third dummy line DL3 positioned in the peripheral area PA may be removed through the drying process. The third solvent forming the first dummy line DL3 may be completely volatilized through the drying process.

During the drying process, the first solvent having the relatively high vapor pressure may be evaporated at a faster rate compared to the second solvent. The peripheral area PA in which the third dummy line DL3 including the first solvent is positioned may be saturated with the first solvent at a high speed. Thereafter, the second solvent having the relatively low vapor pressure may be evaporated. When the second solvent is evaporated, the volatilization rate of the first solvent in the peripheral area PA having relatively high atmospheric saturation may be lowered. The volatilization rates of the first solvent and the second solvent may be substantially the same in a state where a predetermined time has elapsed. The emission layer M3 formed by volatilization of the second solvent may be dried at a same volatilization rate over the display area DA, to thereby have a uniform shape and thickness.

Although the present specification has described an embodiment in which a dummy line is used in a process of forming the first functional layer M1, the second functional layer M2, and the emission layer M3, the present invention is not limited thereto, and a dummy line may be used in a process of forming at least one of the first functional layer M1, the second functional layer M2, and the emission layer M3.

Thereafter, as illustrated in FIG. 22, a third functional layer M4 and a second electrode E2 overlapping an entire surface of the substrate SUB may be formed by using a deposition process. The third functional layer M4 may include at least one of an electron transporting layer (ETL) and an electron injection layer (EIL).

The first functional layer M1, the second functional layer M2, the emission layer M3, and the third functional layer M4 constitute an intermediate layer ML positioned between the first electrode E1 and the second electrode E2.

The second electrode E2 may include a reflective metal including calcium (Ca), barium (Ba), magnesium (Mg), aluminum (Al), silver (Ag), platinum (Pt), palladium (Pd), gold (Au), nickel (Ni), neodymium (Nd), iridium (Ir), chromium (Cr), lithium (Li), calcium (Ca), etc., or a transparent conductive oxide (TCO) such as indium tin oxide (ITO) or indium zinc oxide (IZO).

The first electrode E1, the intermediate layer ML, and the second electrode E2 may constitute a light emitting element. Herein, the first electrode E1 may be an anode which is a hole injection electrode, and the second electrode E2 may be a cathode which is an electron injection electrode. However, the present embodiment is not limited thereto, and the first electrode E1 may be a cathode and the second electrode E2 may be an anode depending on a driving method of an emissive display device.

When holes and electrons are injected from the first electrode E1 and the second electrode E2 into the emission layer M3, excitons formed by combining the injected holes and electrons are emitted when they fall from an excited state to a ground state.

The ink discharged onto the substrate SUB by the inkjet process may have a difference in a drying rate depending on a discharged position. Intermediate layers manufactured at different drying rates will have different thicknesses. Such a non-uniform thickness difference between the intermediate layers may be recognized as an undesired spot. However, according to an embodiment, the intermediate layers formed in the display area DA are dried at a uniform rate by providing dummy lines positioned in the peripheral area, and thus may have a uniform thickness. A display device in which spots are controlled may thereby be provided.

While this invention has been described in connection with what is presently considered to be practical embodiments, it is to be understood that the invention is not limited to the disclosed embodiments, but, on the contrary, is intended to cover various modifications and equivalent arrangements included within the spirit and scope of the appended claims.

Although certain embodiments and implementations have been described herein, other embodiments and modifications will be apparent from this description. Accordingly, the inventive concepts are not limited to such embodiments, but rather to the broader scope of the appended claims and various modifications and equivalent arrangements as would be apparent to a person of ordinary skill in the art.

What is claimed is:

1. A manufacturing method of a display device, the method comprising:
   forming a pixel circuit portion overlapping a display area on a substrate;
   forming a first electrode that is electrically connected to the pixel circuit portion;
   forming a partition wall overlapping a portion of the first electrode;
   forming a dummy line overlapping a peripheral area surrounding the display area by using a dispenser; and
   forming at least a portion of an intermediate layer in the partition wall by an inkjet process.

2. The manufacturing method of claim 1, wherein
   the dummy line includes a first solvent, and
   a viscosity of the first solvent is about 15 cP, while a surface tension of the first solvent is about 35 dyne/cm.

3. The manufacturing method of claim 2, wherein
   the forming of the intermediate layer includes:
   forming a first functional layer;
   forming a second functional layer; and
   forming an emission layer.

4. The manufacturing method of claim 3, wherein
   the forming of the first functional layer includes discharging and drying a first ink,
   the forming of the second functional layer includes discharging and drying a second ink, and
   the forming of the emission layer includes discharging and drying a third ink.

5. The manufacturing method of claim 4, wherein
   the first ink, the second ink, and the third ink include a second solvent.

6. The manufacturing method of claim 5, wherein
   a vapor pressure of the second solvent is lower than that of the first solvent.

7. The manufacturing method of claim 6, wherein
   the forming of the dummy line includes
   forming a second dummy line before the forming of the second functional layer.

8. The manufacturing method of claim 7, wherein
   the second dummy line is removed in the drying of the second ink.

9. The manufacturing method of claim 6, wherein
   the forming of the dummy line includes
   forming a third dummy line before the forming of the emission layer.

10. The manufacturing method of claim 9, wherein
    the third dummy line is removed in the drying of the third ink.

11. The manufacturing method of claim 6, wherein
    the first functional layer is a hole injection layer, and the second functional layer is a hole transport layer.

12. The manufacturing method of claim 6, further comprising:
    forming a third functional layer and a second electrode disposed on the emission layer.

13. The manufacturing method of claim 5, wherein
    the second solvent has a vapor pressure range of 1 to $10^{-6}$ Torr at room temperature (25° C.) and atmospheric pressure.

14. The manufacturing method of claim 13, wherein
    a vapor pressure of the first solvent is higher than that of the second solvent.

15. The manufacturing method of claim 14, wherein
    a volatilization rate of the first solvent is greater than that of the second solvent.

16. The manufacturing method of claim 5, wherein
    the first solvent includes at least one of cyclopentane, thiophene, n-butylcyclopentane, n-butylbutyrate, hexylacetate, n-butylcyclohexane, tri methylbenzene, p-diethylbenzene, n-butylbenzene, 1,2-diethylbenzene, n-heptylacetate, propyl glycol, and propylene glycol, and
    the second solvent includes at least one of cyclohexyl benzene, 2-ethyl naphthalene, ethyl benzoate, triethylene glycol monomethyl ether, butyl benzoate, ethylhexyl benzoate, and benzyl benzoate.

17. The manufacturing method of claim 4, wherein
    the forming of the dummy line includes
    forming a first dummy line before the forming of the first functional layer.

18. The manufacturing method of claim 17, wherein
    the first dummy line is removed in the drying of the first ink.

19. The manufacturing method of claim 1, wherein
    the dummy line is formed in a lattice shape in a plan view.

* * * * *